United States Patent [19]

Van der Sanden

[11] Patent Number: 5,923,387
[45] Date of Patent: Jul. 13, 1999

[54] PICTURE DISPLAY APPARATUS AND METHOD OF GENERATING A FOCUSING VOLTAGE

[75] Inventor: Robert C. C. Van der Sanden, Eindhoven, Netherlands

[73] Assignee: U.S. Philips Corporation, New York, N.Y.

[21] Appl. No.: 08/870,057

[22] Filed: Jun. 5, 1997

[30] Foreign Application Priority Data

Jun. 26, 1996 [EP] European Pat. Off. ............. 96201777

[51] Int. Cl.⁶ .............................. H04N 3/22; H04N 9/28
[52] U.S. Cl. ........................ 348/806; 348/805; 348/745; 315/368.18; 315/382
[58] Field of Search .................................. 348/806, 805, 348/807, 745, 746, 747; 315/368.11, 368.18, 368.21, 368.23, 368.24, 370, 382; H04N 3/22, 9/28

[56] References Cited

U.S. PATENT DOCUMENTS

| | | | |
|---|---|---|---|
| 4,216,392 | 8/1980 | Valkestijn ............................... | 327/125 |
| 4,353,013 | 10/1982 | Lehman .................................. | 315/387 |
| 4,361,785 | 11/1982 | Stapleton ............................... | 315/389 |
| 4,733,140 | 3/1988 | Oliver .................................... | 315/371 |
| 4,961,030 | 10/1990 | Ogino et al. ........................... | 348/746 |
| 5,583,581 | 12/1996 | Adachi et al. ......................... | 348/806 |
| 5,780,978 | 7/1998 | Bang ...................................... | 348/806 |
| 5,847,777 | 12/1998 | George .................................. | 348/746 |

FOREIGN PATENT DOCUMENTS

403265389  11/1991  Japan .

*Primary Examiner*—John K. Peng
*Assistant Examiner*—Linus H. Lo
*Attorney, Agent, or Firm*—John C. Fox

[57] ABSTRACT

A focusing waveform (Vf) is obtained by first generating (2) two intersecting triangular waveforms of opposite phase and half the deflection frequency. Subsequently, the difference between these two triangular waveforms is multiplied by itself for generating a second-order parabolic waveform at the deflection frequency, at which the parabolic waveform has a lower side which is located at zero and is not disturbed by DC offsets. In an advantageous embodiment of the invention, which is eminently suitable for multimedia applications, the focusing waveform has the correct form and amplitude, independent of the deflection frequency.

8 Claims, 8 Drawing Sheets

PICTURE DISPLAY APPARATUS AND METHOD OF GENERATING A FOCUSING VOLTAGE

BACKGROUND OF THE INVENTION

The invention relates to a picture display device comprising:

- a display tube (CRT) and deflection means (L) for deflecting an electron beam in the display tube (CRT) at a deflection frequency, and
- a focusing circuit (FC) comprising an input for receiving an input signal (flb) synchronized with the deflection frequency and an output for supplying a focusing signal (Vf) for the display tube (CRT), the focusing signal (Vf) having a repetition frequency which is equal to the deflection frequency, the focusing circuit (FC) comprising a multiplier (3; IC3) receiving a signal being related to the input signal (flb).

The invention further relates to a focusing circuit as described in the introductory part of claim 7.

The invention also relates to a method of generating a display tube focusing signal.

From U.S. Pat. No. 4,216,392 is known to generate a focusing waveform suitable for driving a focusing electrode of a cathode ray tube. The known circuit generates a parabolic focusing waveform by multiplying a sawtooth waveform synchronized with the deflection frequency by itself.

It is difficult to prevent a shifting of DC-levels if the sawtooth waveforms are multiplied by itself. If higher order waveforms are desired, these DC-levels produce undesired low-order components in the output signal which is generated by multiplication of the sawtooth waveform by itself.

OBJECTS AND SUMMARY OF THE INVENTION

It is an object of the invention to provide a simple focusing circuit for generating a waveform which approximates the desired shape to a better degree.

To this end, a first aspect of the invention provides a picture display apparatus provided with a focusing circuit as defined in claim 1.

A second aspect of the invention provides a focusing circuit as defined in claim 7.

A third aspect of the invention provides a method of generating a focusing waveform as defined in claim 8.

Advantageous embodiments are described in the dependent claims.

The focusing circuit according to the invention generates a waveform by starting from two triangular waveforms having an opposite phase of half the deflection frequency. The two triangular waveforms intersect each other. If a symmetrical correction is desired, the triangular waveforms will intersect each other in the middle of the display screen. The deflection frequency is the horizontal or vertical deflection frequency, dependent on the desired focusing waveform. By multiplying the difference of these two triangular waveforms by itself, a second-order parabola of the deflection frequency is produced whose lower side is at zero, namely at the location of the point of intersection. In contrast to the known circuit, there is no disturbance of the second-order parabola due to integration or multiplication of a DC component which occurs in the sawtooth to be integrated or multiplied, or due to a DC-component which is produced by the integration or multiplication in an undesirable manner.

There are no difficult measures required to prevent such a DC component. If desired, a fourth-order waveform can be obtained by multiplying this second-order parabola by itself.

It is an additional problem that the display tubes requiring a dynamic astigmatic focusing (further referred to as DAF display tubes) have a too small spot height, when driven by means of the known parabolic focusing voltage, in an area which is slightly remote from the left and right edges of a display screen of the display tube. Dependent on the vertical structure of a mask of the display tube and a mutual distance of the deflected horizontal lines on the screen, a Moiré pattern is produced due to the too small spot height. By correct choice of the mask structure it is generally quite possible to prevent Moiré from occurring at a given horizontal deflection frequency and line number (and hence a given mutual line spacing). If many horizontal deflection frequencies with associated line numbers are to be displayed, it is often impossible to find a compromise. Therefore it is known to generate a parabolic focusing voltage with a too small amplitude so that the spot diameter does not reach the minimal value. In this way, Moiré is prevented but the spot throughout the screen will be larger than minimal, while the optimum sharpness cannot be achieved.

An embodiment of the focusing circuit according to the invention, characterized as described in claim 2, generates a fourth order waveform by multiplying the second order parabola waveform by itself. The fourth order waveform has the advantage that a minimum spot size throughout the screen is possible without a disturbing Moiré pattern occurring in the area between the center and the extreme edges of the display screen. The multiplication of the second order parabola by itself does not give rise to undesired waveforms due to DC-offsets. The second order parabola has a bottom on zero level.

The multiplication of the sawtooth waveform by itself according the prior-art has the further drawback that the part of the sawtooth waveform occuring during the flyback period causes a small parabola which causes an extra dissipation in the amplifier.

In an embodiment of the focusing circuit according to the invention, characterized as described in claim 3, the amplitude of the waveform having the parabola shape or the fourth order waveform is limited during at least a part of a flyback period of the deflection. This has the advantage that the amplitude of the waveform becomes smaller and that there is less dissipation in the amplifier. Limiting of the amplitude is not visible on the screen because this is effected during the flyback period.

An embodiment of the focusing circuit according to the invention, characterized as described in claim 4, has the advantage that the waveform having the parabola shape or the fourth order waveform is independent of the deflection frequency. To this end, the amplitude of the triangular waveforms is controlled in dependence upon the DC contents or mean value of the limited second or fourth-order waveform. If the frequency increases, the amplitude of the triangular waveform will decrease and the amplitude of the second or fourth-order waveform will become too small. The part of the second or fourth-order waveform which is limited will become smaller, and the DC content of the limited second or fourth-order signal decrease. The desired shape of the second or fourth order waveform is restored by increasing the amplitude of the triangular waveform (for example by increasing a current for charging a capacitor) until the DC contents is restored.

It is known to generate a focusing waveform by integrating a transformed horizontal deflection current with a capacitor. The horizontal deflection current is transformed via a primary winding to a secondary winding of a current transformer. A capacitor integrating the transformed horizontal current is arranged parallel to the secondary winding of the current transformer. The voltage across the capacitor is connected to the focusing electrode of the picture tube. Since the horizontal deflection current approximately has a sawtooth shape, the focusing voltage across the capacitor will approximately have a parabolic shape. This known focusing circuit has the drawback that the integration time of the deflection current changes and the amplitude of the focusing voltage also changes in the case of a changed deflection frequency.

An embodiment of the focusing circuit according to the invention, characterized as described in claim 5, has the advantage that there is less dissipation in the output amplifier. The amplitude of the waveform is now limited by giving both triangular waveforms a zero slope (thus a flat part) in at least a part of the flyback period. In principle, the triangular waveforms have a symmetrical variation during the sweep period. Outside the sweep period, hence outside the visible part of the display screen, the waveforms do not need. to be symmetrical. Moreover, a small asymmetry may be desirable, dependent on tolerances of the display tube.

An embodiment of the focusing circuit according to the invention, characterized as described in claim 6, has the advantage that the waveform has the exact shape and amplitude, independent of the deflection frequency.

These and other aspects of the invention will be apparent from and elucidated with reference to the embodiments described hereinafter.

DESCRIPTION OF THE PREFERRED EMBODIMENTS

Figure 1:
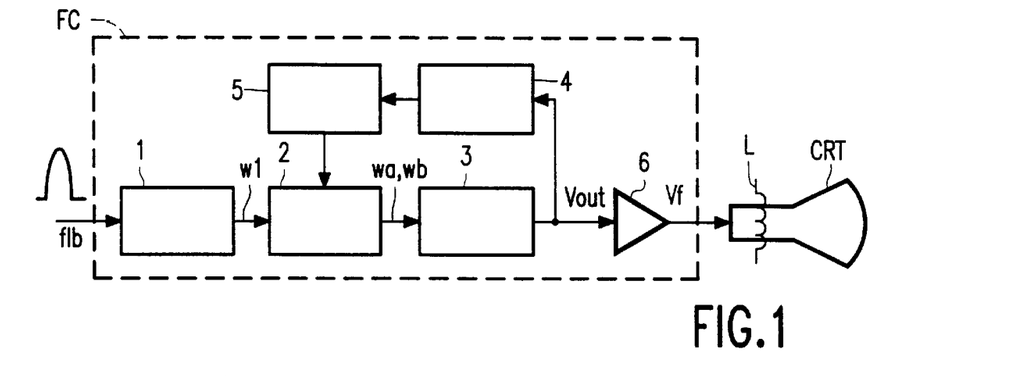
FIG. 1 shows a circuit for generating a focusing voltage according to the invention.
Figure 2:
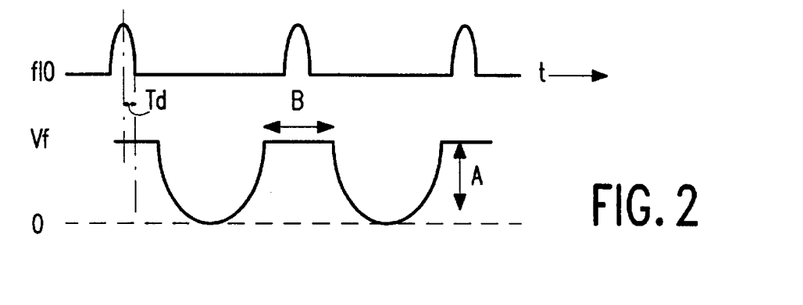
FIG. 2 shows waveforms of the input and the output signal in the circuit of FIG. 1.

FIG. 1 shows a focusing circuit FC comprising a waveform-generating circuit 1, 2, 3, 4, 5 and an amplifier 6. In this case, the waveform-generating circuit receives a horizontal flyback pulse flb and supplies an output waveform Vout which in this case is a fourth-order waveform at the repetition frequency of the horizontal deflection. It is alternatively possible to generate a second or other even order waveform in the same way by choosing the number of multipliers in conformity therewith. The amplifier 6 amplifies the small amplitude of the fourth-order waveform Vout to a desired value Vf required by the display tube (for example, 1200 volts) upon driving a focusing electrode. Instead of the horizontal flyback pulse, another pulse may alternatively be used, for example, a pulse indicating the horizontal position on the display screen, or the horizontal sync pulse. The circuit may also be used for generating a vertical second or fourth-order output waveform Vout. FIG. 2 shows the horizontal flyback pulse flb and the focusing voltage Vf in function of time. It should be possible to adjust the following parameters of the waveform:

the amplitude A, the width B of the flat top between two successive second or higher order parabolas, desired during blanking (for example: approximately 18% blanking time, 82% active video), and a centering of the flat top with respect to the middle of the flyback pulse, shown as a time shift Td.

Figure 3:
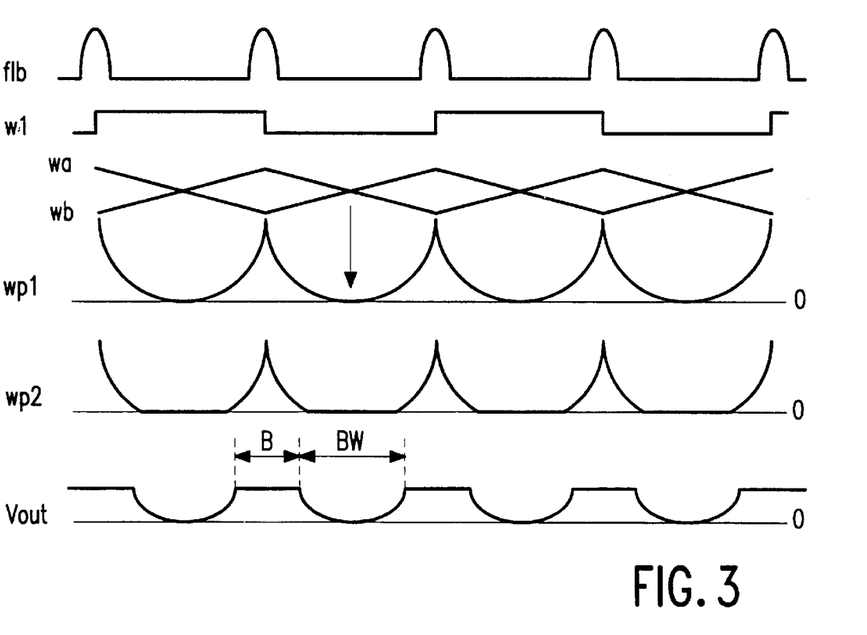
FIG. 3 shows waveforms which occur in the circuit of FIG. 1.
Figure 4:
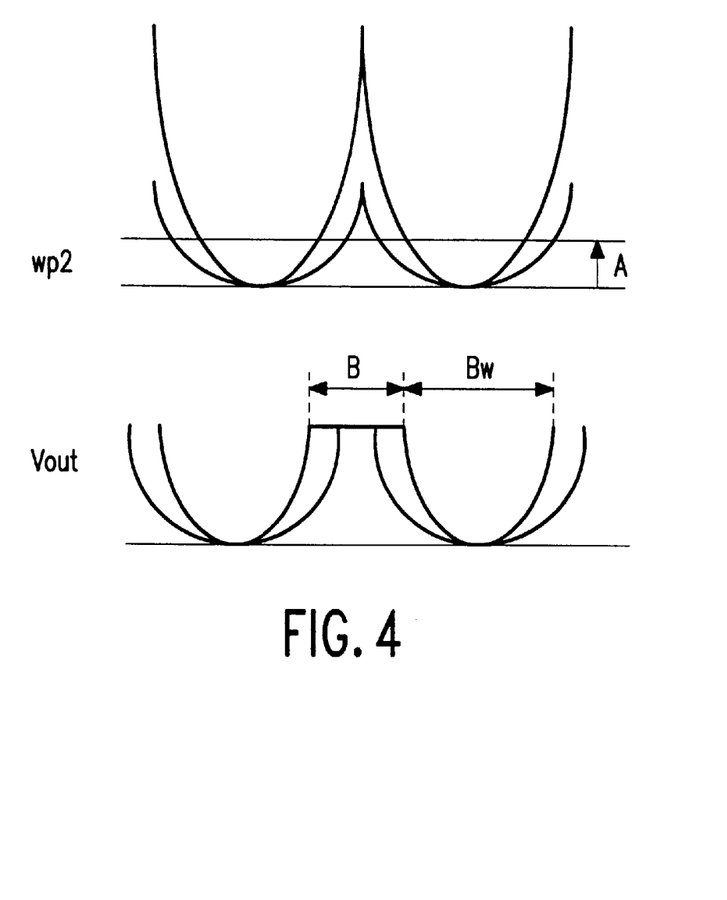
FIG. 4 shows that the width of the fourth-order waveform after limiting depends on the amplitude of the fourth-order waveform before limiting.

FIG. 1 shows a technical realization of a focusing circuit FC according to the invention, and FIG. 3 shows waveforms as occur in this technical realization. The flyback pulse flb with a repetition frequency equal to the deflection frequency is divided in a divider 1 to obtain a block shaped pulse w1 with a repetition frequency of half the deflection frequency f/2, see FIG. 3. The triangular waveform generator 2 generates from the block shaped pulse w1 two intersecting triangular signals wa, wb with opposite phase. The difference between these two triangular signals wa, wb is determined in a parabola-generating circuit 3. The difference is multiplied by itself for generating a second-order parabola wp1 of the double (=line) frequency whose lower side is at 0 V. This parabola wp1 is multiplied once more by itself to form a fourth-order signal wp2 whose lower side is also at 0 V. The fourth-order signal wp2 is limited at a fixed amplitude, with which the output signal Vout is produced. The amplitude A is then fixed and the flat top is obtained.

The width B of the flat top and hence the effective width Bw, on the display screen, of the fourth-order waveform wp2 can be adjusted by controlling the amplitude of the triangular signals wa,wb and hence the non-limited fourth-order waveform wp2. If no fourth-order waveform is necessary, the second-order parabola may be limited in the same way.

The ratio of the width of the fourth order parabola part of the fourth-order waveform wp2 and the width B of the flat top may be maintained at an adjusted value at a varying deflection frequency by applying a control system which adapts the amplitude of the triangular signals wa,wb, dependent on the DC contents (or mean value) of the limited output waveform Vout. The mean value of the limited signal Vout may be obtained, for example by passing it through a low-pass filter 4. At a fixed value for the amplitude A, a DC level is obtained which increases as the top becomes wider. At a higher DC level, a control circuit 5 reducing the amplitude of the triangle signals wa,wb in the triangular waveform generator 2. The amplitude of the non-limited fourth order waveform wp2 decreases and the top becomes narrower so that the DC level of the output waveform Vout decreases. This causes the output waveform Vout to be scaled with the time scale and, as a result, the circuit is suitable for autosync applications.

It is known to generate a focusing waveform having a small amplitude by means of a waveform-generating circuit. An amplifier amplifies the focusing waveform to a focusing signal suitable for driving a focusing electrode or a focusing coil system of a display tube. The known waveform-generating circuit generates a parabolic focusing waveform by integrating a sawtooth waveform synchronized with the deflection or by multiplying the sawtooth-waveform by itself.

The parabola waveform wp 1 is generated without a divider 1 and without two intersecting triangular waveforms wa,wb. In this case, a parabola is obtained by first integrating a current at a capacitor to obtain a sawtooth waveform, and then integrating or multiplying the sawtooth waveform. This has a number of practical drawbacks:

a) the sawtooth which would then be used has a flyback somewhere around the flyback pulse. To prevent a "slanted" parabola from being obtained after multiplication, this sawtooth must be satisfactorily centered around 0 V. The use of a coupling capacitor for this purpose imposes requirements on the flyback of the sawtooth voltage. This voltage must be satisfactorily symmetrical so as to maintain the signal correctly centered. Or, in other words, the sawtooth waveform has to be well centered around zero to prevent generation of a "slanted" parabola waveform after integration of the sawtooth waveform. The slanted parabola is the addition of a parabola caused by a well centered sawtooth and a sawtooth caused by a DC component in the sawtooth waveform. If a coupling capacitor is used to remove the DC component from the sawtooth waveform, special requirements have to be imposed on the part of the sawtooth waveform occuring during the flyback period. This flyback part has to be satisfactorily symmetrical as to maintain the parabola waveform correctly centered. So, although the shape of the flyback part of the sawtooth waveform is not relevant for the visible part of the waveform on the display screen, this shape is important for the centering of the sawtooth waveform. Further, the capacitor causes an e-power disturbance, and an inertness in the circuit if the deflection frequency changes.

b) the flyback yields a narrow extra parabola after multiplication, which causes extra dissipation in the output stage.

c) with frequent integration for obtaining a higher order signal, there is a risk that DC levels will vary. Integration of these DC levels themselves yields unwanted lower order components in the output signal.

d) integration is frequency-dependent because the period of time during which integration takes place influences the resultant amplitude. The known circuit generates a focusing voltage Vf with an amplitude which depends on the deflection frequency. At a higher deflection frequency less time is available to generate the sawtooth waveform by integrating, so a focussing voltage Vf will be generated with a lower amplitude.

The circuit according to the invention uses a divider to obtain a satisfactorily symmetrical and offset-free triangular signal and does not have the previously mentioned drawbacks. In an advantageous embodiment, the top-width control as described above is applied.

Figure 5:
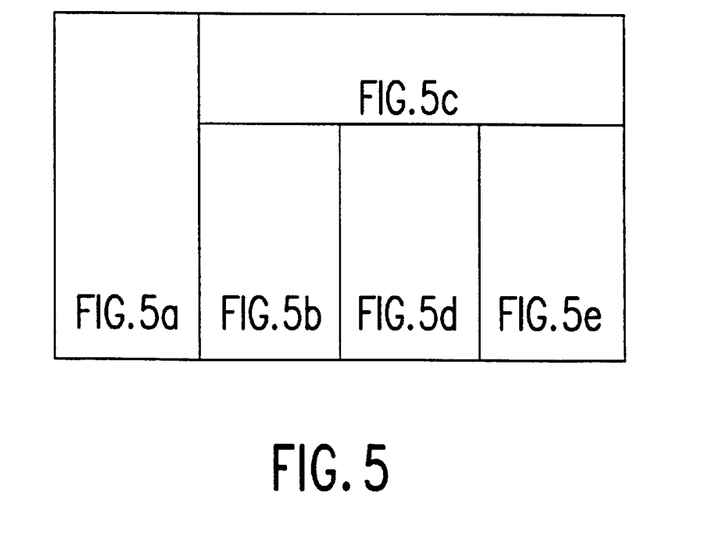
FIG. 5 shows a detailed embodiment of the focusing circuit according to the invention.
Figure 5A:
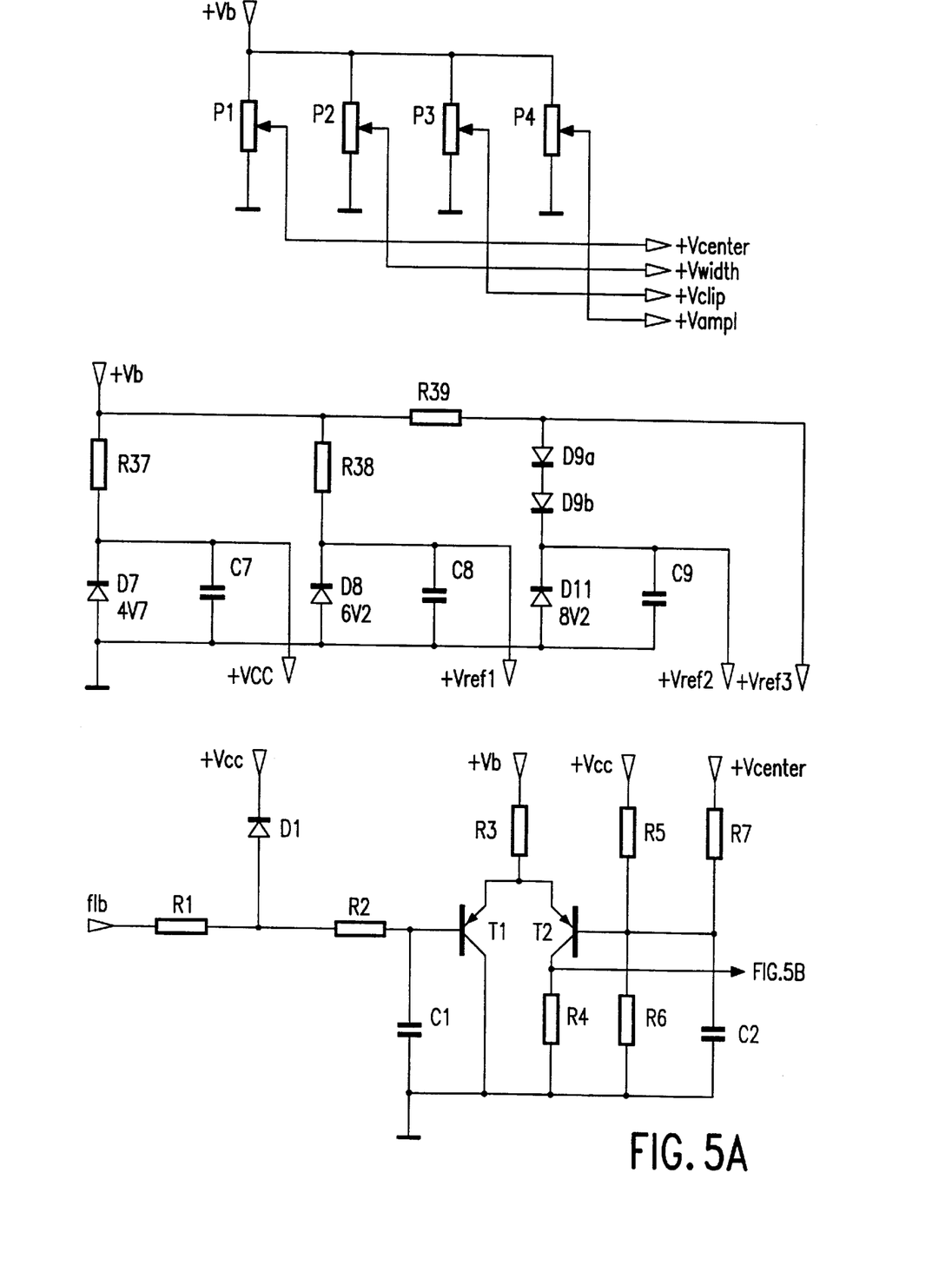
Figure 5B:
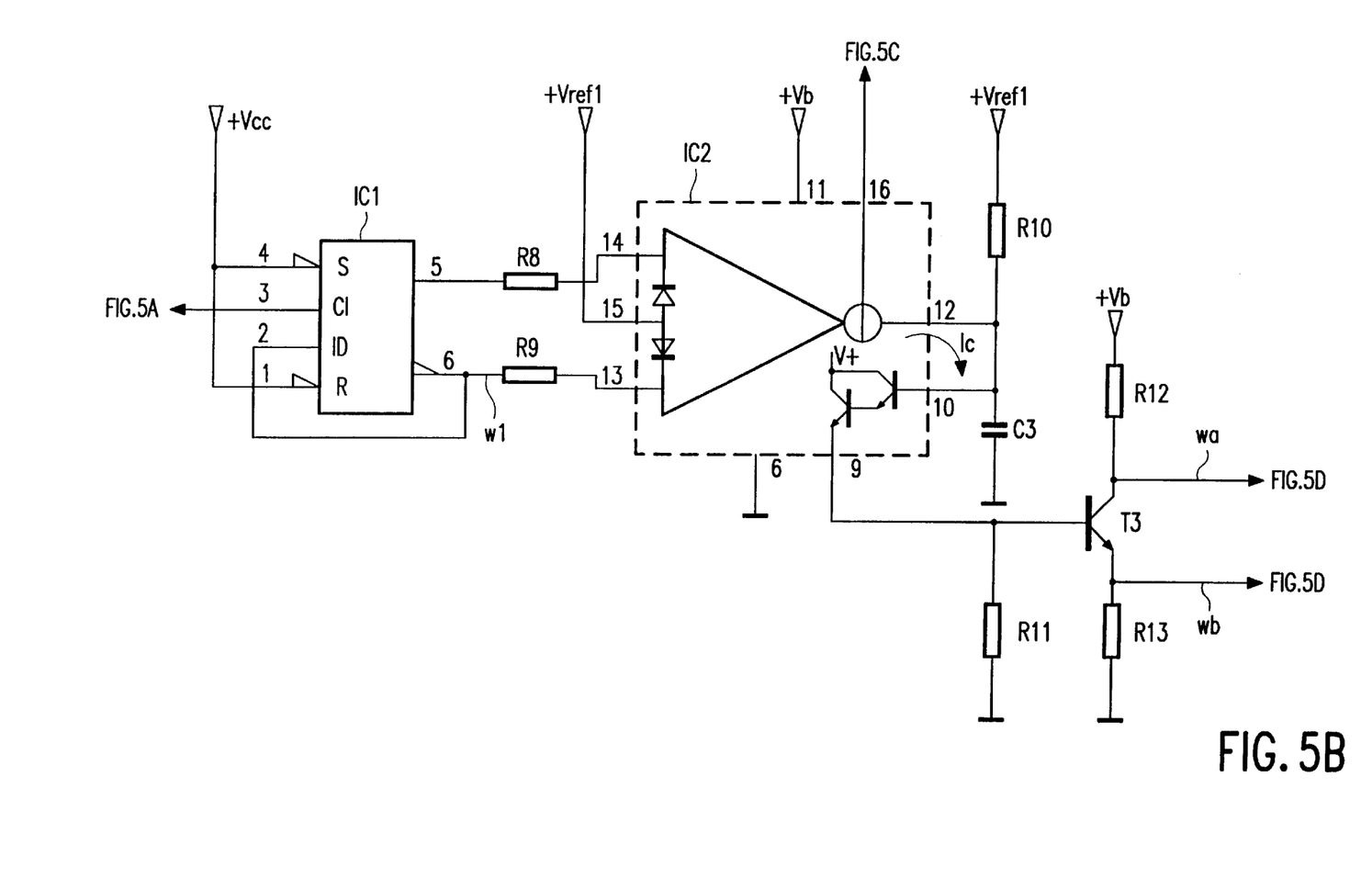
Figure 5C:
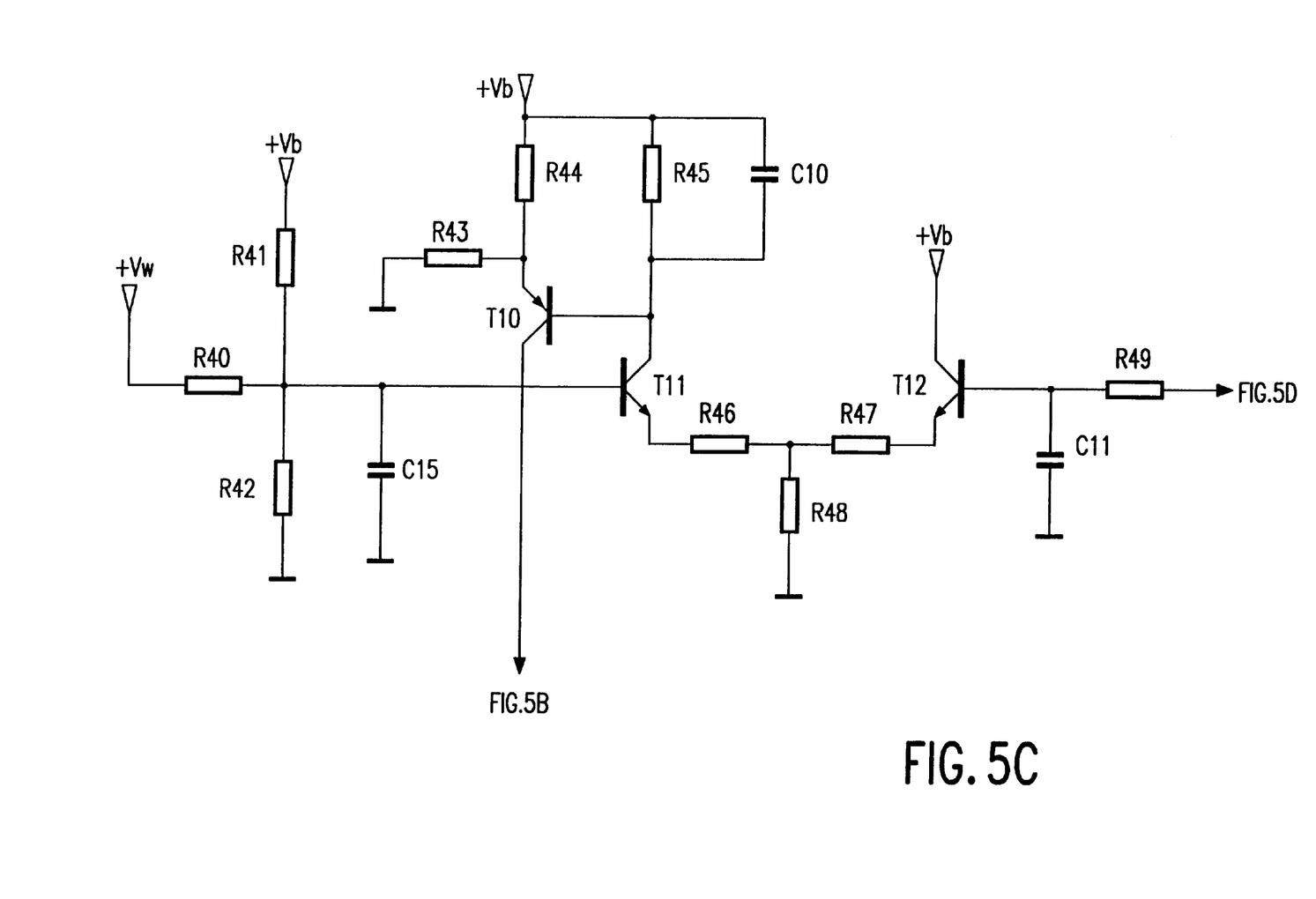
Figure 5D:
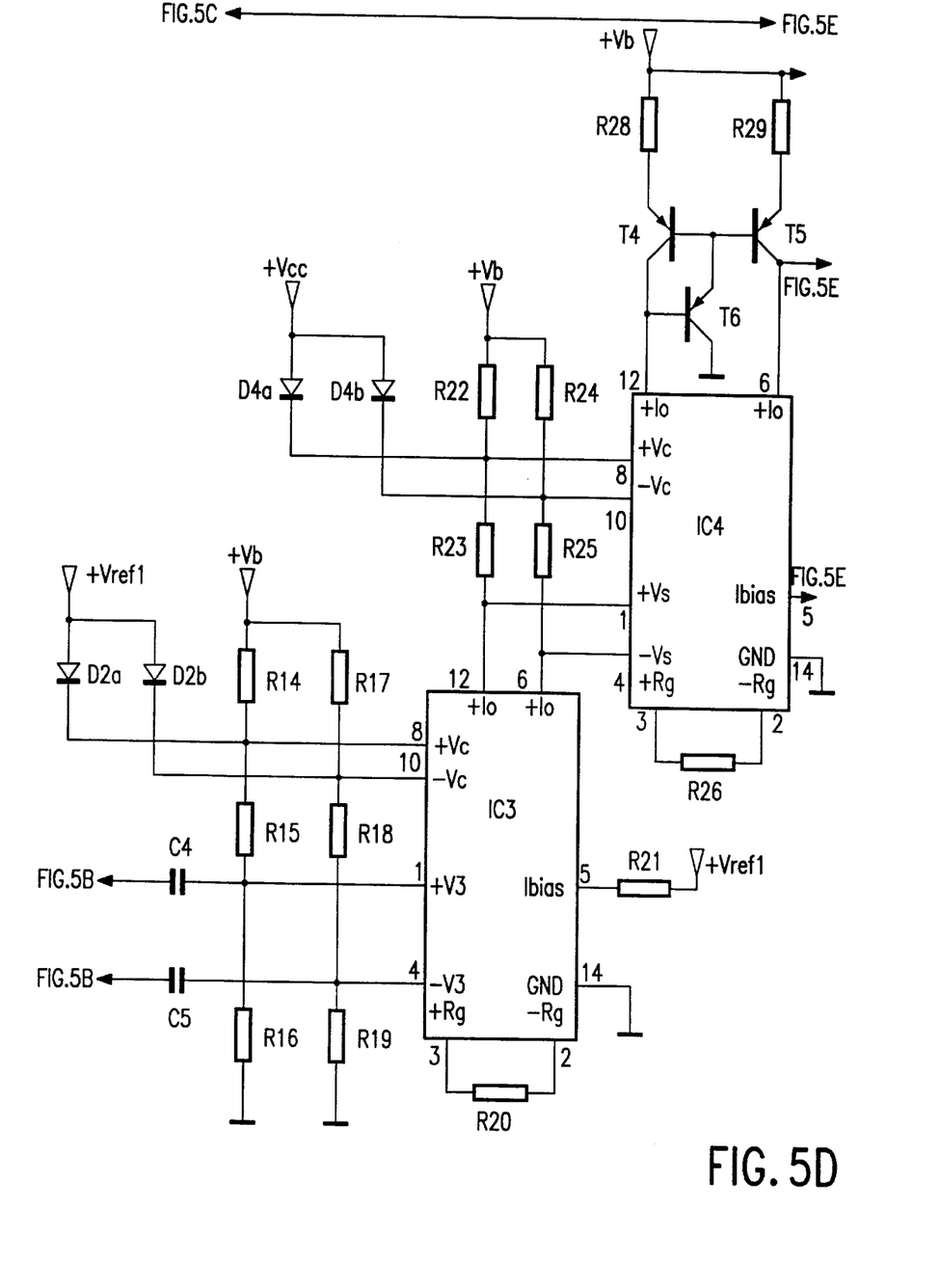
Figure 5E:
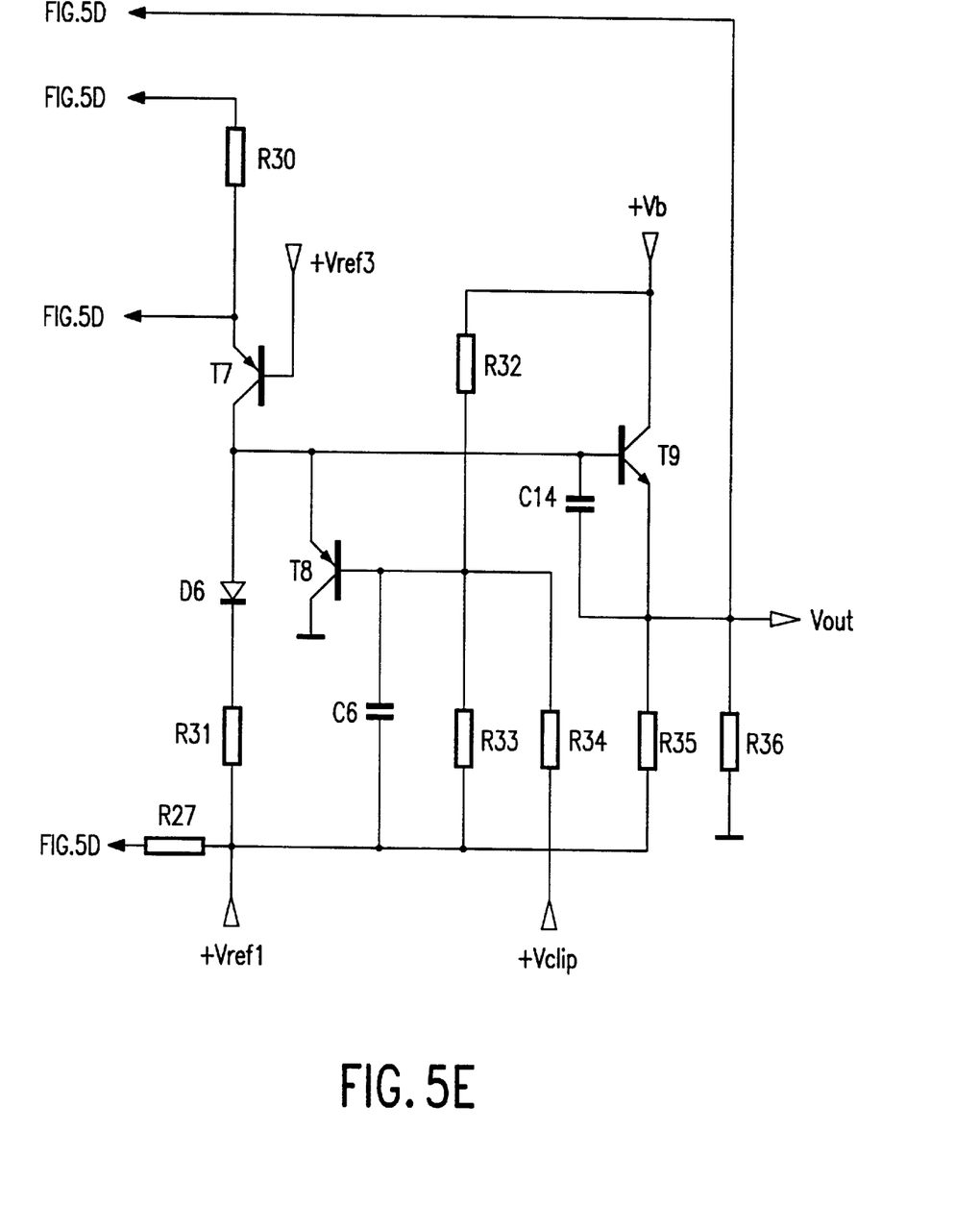

FIG. 5 shows a detailed circuit diagram of a focusing circuit FC according to the invention. The circuit for generating a horizontal focusing waveform is shown by way of example. The output stage and the generation of a vertical parabolic voltage which may also be amplified in the output stage are not shown.

In this circuit diagram, the delay circuit for centering the parabola waveform wp1 around the flyback pulse flb can be seen around the transistors T1 and T2. The integrated circuit IC1 is part of the divider 1, the integrated circuit IC2 is part of the triangular waveform generator 2. Both polarities of the triangular waveform wa,wb are inputted in a balanced way in the first squaring stage built around the integrated circuit IC3. The squared difference of the triangle waveform is subsequently squared again in the integrated circuit IC4. Transistor T8 limits the signal, transistor T9 forms a buffer.

Via resistor R49, the DC content of the output signal Vout is available at capacitor C11, where it is compared with a desired value Vw by means of the differential stage comprising the transistors T11 and T12. Via transistor T10, the amplitude of the triangle waveforms wa,wb is corrected in the integrated circuit IC2.

The operation of the focusing circuit FC according to FIG. 5 will now be described in greater detail. Via resistor R1, a line flyback pulse flb is presented, for example at an amplitude of 12 V. Diode D1 forms a slightly more square wave-shaped pulse therefrom. This pulse is converted by the low-pass filter around resistor R2 and capacitor C1 into an e power waveform. The comparator (transistors T1 and T2) compares the e power with an adjustable voltage Vcenter, and when it is reached, a rising edge is produced across resistor R4. The delay between a leading edge of the puls and the rising edge across resistor R4 is dependent on the level at the base of transistor T2. The integrated circuit IC1$a$ is triggered on the rising edge to divide this incoming pulse to half the frequency. The pins 5 and 6 of the integrated circuit IC1$a$ convey two square waves in opposite phase at half the line frequency and a duty cycle of 50%.

The OTA (IC2$a$) constitutes a switch which causes the current Ic presented by the collector of transistor T10 to flow into or out of pin 12 of the OTA, dependent on the polarity of the square waves presented. The current into or out of pin 12 of the OTA discharges or charges the capacitor C3. A triangular voltage of half the frequency is produced across capacitor C3. Transistor T3 is a +1/−1 amplifier which supplies the same signal twice, but in opposite phase. These two signals which are the triangle waveforms wa,wb are applied to the multiplier IC3. Multiplier IC3 comprises a Gilbert cell as a 4-quadrant multiplier. The difference signal between pins 1 and 4 of the multiplier IC3 is multiplied by the difference signal between pins 8 and 10 of the multiplier IC3. The signal at the pins 1 and 4 is also applied to the pins 8 and 10 via resistors R15 and R18. The difference signal of the triangle waveforms wa,wb is thus multiplied by itself. The squared signal which is the parabola waveform wp1 is availabe as differential current at the pins 12 and 6 of the multiplier IC3. The squared difference signal is converted into a voltage by means of resistors R23 and R25 and passed on to pins 8 and 10 of multiplier IC4. Multiplier IC4 operates in the same way as multiplier IC3. The diodes D2$a,b$ and D4$a,b$ are used to linearize the signal for the upper section of the Gilbert cell. The differential current from the pins 12 and 6 of multiplier IC4 are deprived from their DC component by the current mirror around transistors T4, T5 and T6 and applied to transistor T7. Resistor R30 supplies a small bias current through transistor T7 so as to keep this transistor also turned on to some extent in the dip of the fourth order parabola waveform wp2. The current from the collector of transistor T7 is converted into a voltage by resistor R31. Diode D6 compensates the Vbe loss which occurs in the emitter-follower T9. Transistor T8 clips the top of the fourth-order signal as soon as it exceeds the value adjusted by means of +Vclip and thus gives the signal Vout a flat top. Resistor R49 and capacitor C11 smooth the resultant parabola to a DC voltage which comprises information about the DC contents and hence about the width B of the top of the signal in proportion to the width of the fourth-order parabola part of the fourth order output waveform Vout. The circuit around transistors T10, T11 and T12 constitutes a, differential amplifier with a dominant pole (R45 and C10) which controls the bias current for integrated circuit IC2$a$ in such a way that the width B of the flat top of the output signal remains percentually equal, independent of the deflection frequency. The desired value of the width B of the flat top is obtained via the resistors R40, R41 and R42.

With some adaptations, the circuit can be satisfactorily integrated in, for example, an AutoSync Deflection Processor IC.

Figure 6:
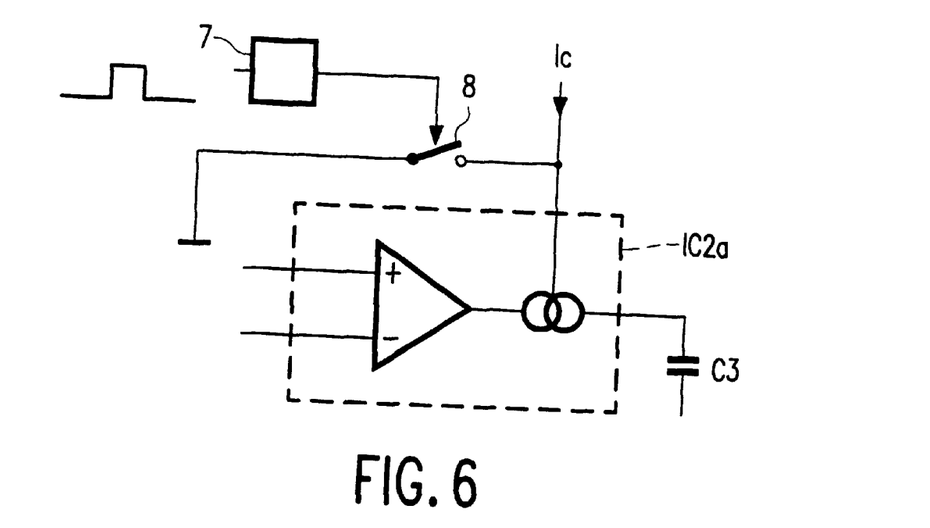
FIG. 6 shows a circuit for obtaining a flat part in the triangular waveforms.
Figure 7:
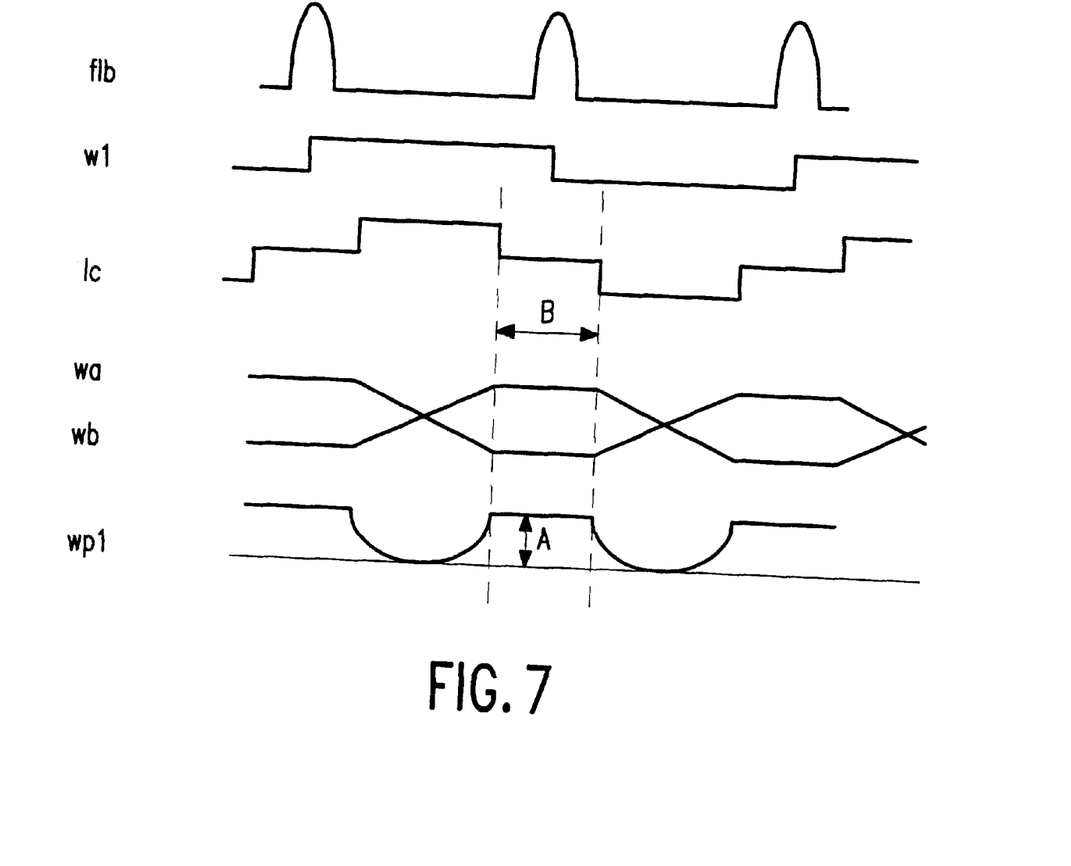
FIG. 7 shows waveforms which occur in the focusing circuit of FIG. 6.

FIG. 6 shows another embodiment of the triangular waveform generator 2. This triangle waveform generator 2 generates two intersecting triangular waveforms wa,wb which have a flat part at least during a part of the flyback period. In this way, it is possible to obtain a flat top between two fourth (or second)-order focusing waveforms in a manner other than by limiting. To this end, the control current Icontrol from transistor T10, which is integrated to a triangular voltage via integrated circuit IC2a in capacitor C3, is conveyed to ground by means of a switch 8. The triangular wave then acquires a flat edge during the period when the switch is closed, see FIGS. 6 and 7. FIG. 7 shows that the flat top is directly realized in the triangular wave. The top width B is now adjusted by controlling said switch 8 by means of an adjustable timer 7. A drawback in this case is that the timer 7 must already be triggered before the flyback pulse occurs. The operation can be improved by adding a PLL. The pulse width of the timer 7 should be synchronous with the deflection frequency to enable autosync application. The amplitude A of the top is now maintained constant by making use of a peak detector which determines the peak value of the parabola waveform wp1 or of the fourth order waveform wp2. The top width control which operates with a limiter and the measurement of the DC contents is eliminated.

It is to be noted that the above-mentioned embodiments elucidate rather than limit the invention and that those skilled in the art will be able to supply alternative embodiments without passing beyond the scope of the claims. Reference signs between brackets in the claims should not be explained as a limitation of these claims. The focusing circuit may be entirely or partly replaced by a suitably programmed computer. The focusing circuit according to the invention is extremely suitable for use in a multimedia apparatus which should be suitable for displaying images at different resolutions and deflection frequencies, at which a small spot dimension is necessary for displaying high-resolution images. The focussing waveform can also be used to drive a focussing coil instead of a focussing electrode.

I claim:

1. A picture display apparatus comprising:
    a display tube (CRT) and deflection means (L) for deflecting an electron beam in the display tube (CRT) at a deflection frequency, and
    a focusing circuit (FC) comprising an input for receiving an input signal (flb) synchronized with the deflection frequency and an output for supplying a focusing signal (Vf) for the display tube (CRT), the focusing signal (Vf) having a repetition frequency which is equal to the deflection frequency, the focusing circuit (FC) comprising a multiplier (3; IC3) receiving a signal being related to the input signal (flb), characterized in that the focusing circuit (FC) further comprises:
    a divider (1) having an input for receiving the input signal (flb), and an output for supplying a divider signal at a repetition frequency which is equal to half the deflection frequency,
    a triangular waveform generator (2) for generating, in response to the divider signal, two intersecting triangular waveforms at opposite phases and half the deflection frequency, and whereby
    the multiplier (3;IC3) is adapted for determining a difference of the two triangular waveforms and for multiplying said difference by itself for generating a waveform having a parabolic shape and a repetition frequency which is equal to the deflection frequency.

2. A picture display apparatus as claimed in claim 1, characterized in that the focusing circuit (FC) comprises a further multiplier (3;IC4) for multiplying the parabola waveform by itself for generating a fourth-order waveform.

3. A picture display apparatus as claimed in claim 1, characterized in that the focusing circuit (FC) further comprises a limiting circuit (3;T8) for limiting an amplitude of the waveform having the parabolic shape or of the fourth order waveform for supplying a limited waveform (Vout).

4. A picture display apparatus as claimed in claim 3, characterized in that the focusing circuit (FC) further comprises:
    a circuit (4) for determining the mean value of the limited waveform (Vout), and
    a control circuit (5) for controlling the amplitude of the triangular waveforms dependent on the mean value of the limited waveform (Vout) for maintaining the mean value of the limited waveform (Vout) constant.

5. A picture display apparatus as claimed in claim 1, characterized in that the triangular waveform generator (2) is adapted to generate the two intersecting triangular waveforms of opposite phase with a zero slope during a period of time covering at least a part of a flyback period of the deflection.

6. A picture display apparatus as claimed in claim 5, characterized in that the triangular waveform generator (2) includes a timer (7) for generating the period of time as a fixed percentage of a total deflection period of the deflection in response to the input signal (flb) synchronized at the deflection frequency, the deflection period being the reciprocal value of the deflection frequency, and that
    the focusing circuit (FC) comprises a peak detector for determining the peak value of the waveform having the parabolic shape, and
    the control circuit (5) is adapted to control the amplitude of the triangular waveforms, dependent on the peak value of the waveform having the parabolic shape for maintaining the peak value of the waveform having the parabolic shape constant.

7. A focusing circuit (FC) comprising an input for receiving an input signal (flb) synchronized with the deflection frequency and an output for supplying a focusing signal (Vf) to the display tube (CRT), the focusing signal (Vf) having a repetition frequency which is equal to the deflection frequency, the focusing circuit (FC) comprising a multiplier (3;IC3) receiving a signal being related to the input signal (flb), characterized in that the focusing circuit (FC) further comprises:
    a divider (1) having an input for receiving the input signal (flb), and an output for supplying a divider signal at a repetition frequency which is equal to half the deflection frequency,
    a triangular waveform generator (2) for generating, in response to the divider signal, two intersecting triangular waveforms at opposite phases and half the deflection frequency, and whereby
    the multiplier (3;IC3) is adapted for determining a difference of the two triangular waveforms and for multiplying said difference by itself for generating a waveform having a parabolic shape and a repetition frequency which is equal to the deflection frequency.

8. A method of generating a display tube focusing signal (Vf), in which the focusing signal (Vf) has a repetition frequency which is equal to a deflection frequency, wherein the method comprises the following steps:

receiving (1) an input signal (flb) synchronized at the deflection frequency, generating (1), in response to the input signal (flb), a divider signal having a repetition frequency which is equal to half the deflection frequency, and generating (2), in response to the divider signal, two intersecting triangular waveforms of opposite phase and half the deflection frequency, determining (3) a difference between the two symmetrical triangular waveforms, and multiplying (3) this difference by itself for generating a waveform which is parabolic and has a repetition frequency which is equal to the deflection frequency.

* * * * *